United States Patent
Yang et al.

(10) Patent No.: US 7,569,475 B2
(45) Date of Patent: Aug. 4, 2009

(54) INTERCONNECT STRUCTURE HAVING ENHANCED ELECTROMIGRATION RELIABILITY AND A METHOD OF FABRICATING SAME

(75) Inventors: Chih-Chao Yang, Poughkeepsie, NY (US); Ping-Chuan Wang, Hopewell Junction, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 11/560,044

(22) Filed: Nov. 15, 2006

(65) Prior Publication Data

US 2008/0111239 A1    May 15, 2008

(51) Int. Cl.
*H01L 21/4763* (2006.01)
(52) U.S. Cl. ....................................................... 438/618
(58) Field of Classification Search ................. 438/618; 257/E21.579, E21.295, E21.584, E23.145, 257/E23.151
See application file for complete search history.

(56) References Cited

U.S. PATENT DOCUMENTS

| | | | |
|---|---|---|---|
| 4,980,752 A * | 12/1990 | Jones, Jr. ..................... | 257/763 |
| 5,585,673 A | 12/1996 | Joshi et al. | |
| 5,695,810 A | 12/1997 | Dubin et al. | |
| 6,069,072 A | 5/2000 | Konecni | |
| 6,285,082 B1 | 9/2001 | Joshi | |
| 6,303,505 B1 | 10/2001 | Ngo et al. | |
| 6,319,819 B1 | 11/2001 | Besser et al. | |
| 6,323,554 B1 | 11/2001 | Joshi et al. | |
| 6,342,733 B1 | 1/2002 | Hu et al. | |
| 6,383,925 B1 | 5/2002 | Ngo et al. | |
| 6,429,128 B1 | 8/2002 | Besser et al. | |
| 6,506,677 B1 | 1/2003 | Avanzino et al. | |
| 6,764,951 B1 | 7/2004 | van Ngo | |
| 6,797,652 B1 | 9/2004 | Ngo et al. | |
| 6,818,557 B1 | 11/2004 | Ngo et al. | |
| 2005/0224979 A1 | 10/2005 | Marathe | |

\* cited by examiner

*Primary Examiner*—Kiesha L Rose
*Assistant Examiner*—Daniel Shook
(74) *Attorney, Agent, or Firm*—Scully, Scott, Murphy & Presser, P.C.; Steven Capella, Esq.

(57) ABSTRACT

An interconnect structure having improved electromigration (EM) reliability is provided. The inventive interconnect structure avoids a circuit dead opening that is caused by EM failure by incorporating a EM preventing liner at least partially within a metal interconnect. In one embodiment, a "U-shaped" EM preventing liner is provided that abuts a diffusion barrier that separates conductive material from the dielectric material. In another embodiment, a space is located between the "U-shaped" EM preventing liner and the diffusion barrier. In yet another embodiment, a horizontal EM liner that abuts the diffusion barrier is provided. In yet a further embodiment, a space exists between the horizontal EM liner and the diffusion barrier.

1 Claim, 7 Drawing Sheets

INTERCONNECT STRUCTURE HAVING ENHANCED ELECTROMIGRATION RELIABILITY AND A METHOD OF FABRICATING SAME

FIELD OF THE INVENTION

The present invention relates to a semiconductor interconnect structure, and a method of fabricating the same. More particularly, the present invention relates to a semiconductor interconnect structure having enhanced electromigration (EM) reliability in which an EM preventing liner is present within a conductive feature of a dielectric material.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits. The problem not only needs to be overcome during the process development period in order to qualify the process, but it also persists through the lifetime of the chip. Voids are created inside the metal conductor of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect, which eventually results in a circuit dead opening.

Figure 1A:
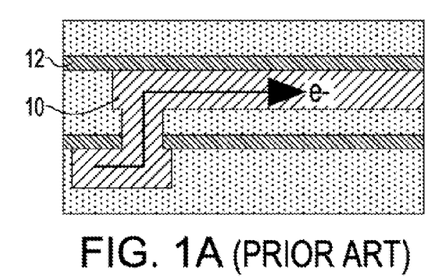
FIGS. 1A-1D are pictorial representations (through cross sectional views) illustrating the formation of a circuit dead opening in a prior art interconnect structure which is caused by EM failure.
Figure 1B:
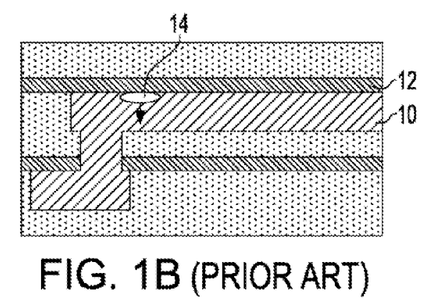
Figure 1C:
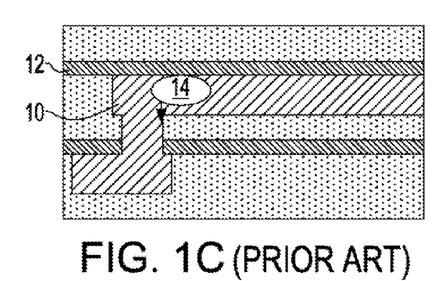
Figure 1D:
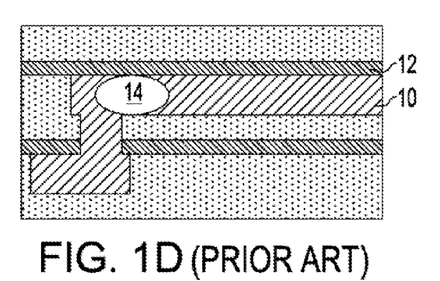

FIGS. 1A-1D are pictorial representations of a prior art interconnect structure at various stages of an EM failure. In these drawings, reference numeral 12 denotes the dielectric cap, and reference numeral 10 denotes the metal interconnect feature; all other components of the prior art interconnect structure are not labeled to avoid obscuring the EM problem. FIG. 1A is at an initial stress stage. FIG. 1B is at a time when void 14 nucleation initiates at the metal interconnect feature 10/dielectric cap 12 interface. FIG. 1A is at a time when the void 14 grows toward the bottom of the conductive feature 10, and FIG. 1D is at a time in which the void 14 growth crosses the metal interconnect feature 10 causing a circuit dead opening.

Figure 2A:
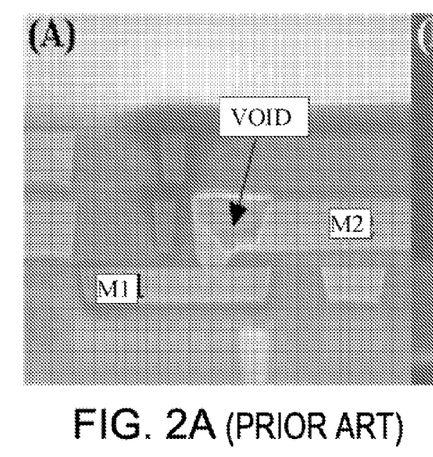
FIGS. 2A-2B are SEM images illustrating the formation of a circuit dead opening in a prior art interconnect structure caused by EM failure.
Figure 2B:
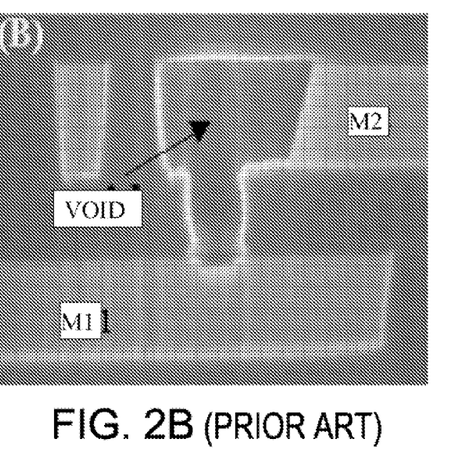

FIGS. 2A-2B are SEM images from a stressed interconnect structure and they illustrate a void forming in the metal line (M2), which implies the mass transport in the metal line occurred along the interface of the metal line and the overlying dielectric cap.

In view of the above, there is a need for providing an interconnect structure which avoids a circuit dead opening caused by EM failure.

SUMMARY OF THE INVENTION

In one aspect, the present invention relates to an interconnect structure having improved EM reliability. The inventive interconnect structure avoids a circuit dead opening that is caused by EM failure by incorporating an EM preventing liner within a metal interconnect. Other benefits of the inventive structure include: prevention of sudden data loss and enhancement of the lifetime of the semiconductor product.

In general terms, the semiconductor interconnect structure of the present invention comprises:

a dielectric material having at least one conductively filled feature located therein, wherein said at least one conductively filled feature includes an electromigration (EM) preventing liner that at least partially separates a first conductive region of said at least one conductively filled feature from a second conductive region of said at least one conductively filled feature.

In one embodiment, a "U-shaped" EM preventing liner is provided that abuts a diffusion barrier that separates the at least one conductively filled feature from the dielectric material. In another embodiment, a space is located between the "U-shaped" EM preventing liner and the diffusion barrier. In yet another embodiment, a horizontal EM liner that abuts the diffusion barrier is provided. In yet a further embodiment, a space exists between the horizontal EM liner and the diffusion barrier.

Another aspect of the present invention relates to a method of fabricating the inventive interconnect structure. The inventive method includes the steps of:

providing at least one opening in a dielectric material, said at least one opening is lined with a diffusion barrier;

forming a first conductive region within said at least one opening;

forming an electromigration (EM) preventing liner on at least a surface of said first conductive region; and forming a second conductive region on said EM preventing liner, said first and second conductive regions form a conductive feature within said dielectric material.

In one embodiment, a "U-shaped" EM preventing liner is provided that abuts the diffusion barrier that separates the conductive feature from the dielectric material. In another embodiment, a space is located between the "U-shaped" EM preventing liner and the diffusion barrier. In yet another embodiment, a horizontal EM liner that abuts the diffusion barrier is provided. In yet a further embodiment, a space exists between the horizontal EM liner and the diffusion barrier.

DETAILED DESCRIPTION OF THE INVENTION

The present invention, which provides an interconnect structure having enhanced electromigration (EM) reliability and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structure or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure having improved EM reliability. The inventive interconnect structure avoids a circuit dead opening that is caused by EM failure by incorporating an EM preventing liner within a metal interconnect.

FIGS. 3A-3D illustrate various embodiments of the present invention. Specifically, FIG. 3A-3D illustrate interconnect structures of the present invention in which the EM preventing liner 66 is located within an opening of a dielectric material 54B which is filled with conductive material 64 and 68. In accordance with the present invention, the conductive material 64 forms a first conductive region, while conductive material 68 forms a second conductive region within second dielectric material 54B. The first and second conductive regions in turn form a conductive feature within the second dielectric material 54B.

Figure 3A:
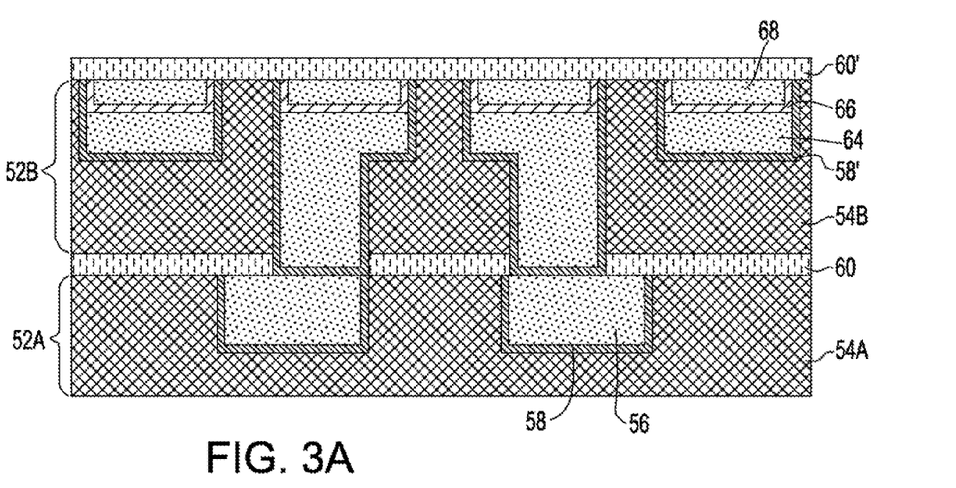
FIGS. 3A-3D are pictorial representations (through cross sectional views) of various interconnect structure of the present invention in which a circuit dead opening is avoided by forming an EM preventing liner within the metal feature.
Figure 3B:
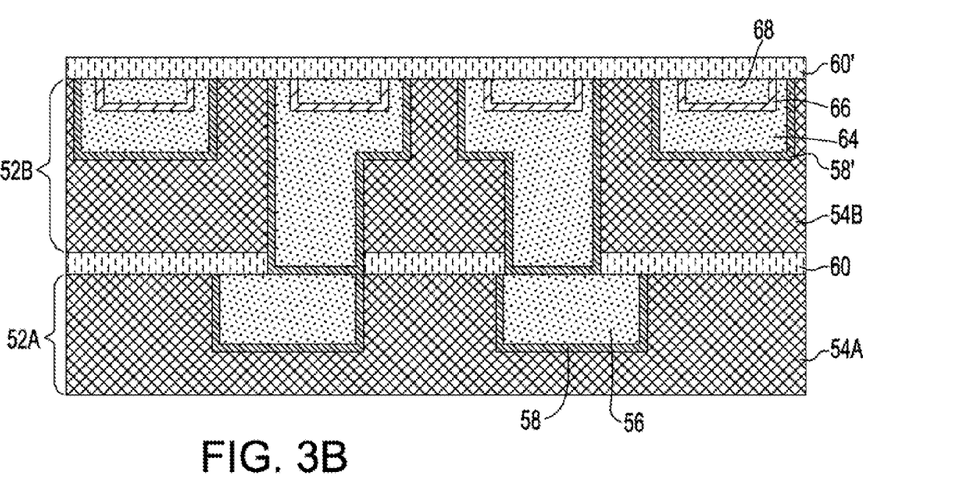
Figure 3C:
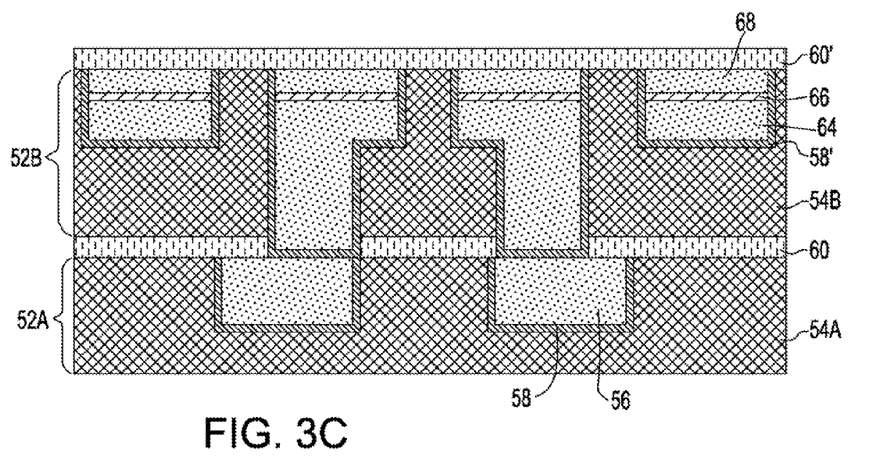
Figure 3D:
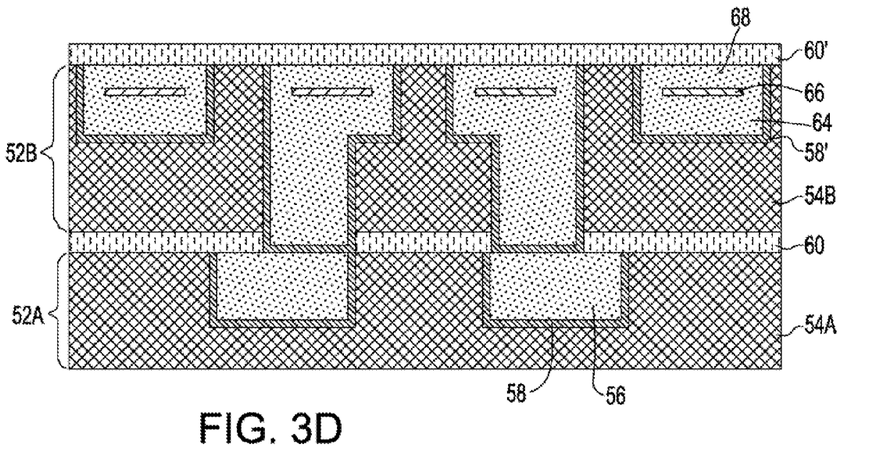

FIG. 3A illustrates a first embodiment of the present invention in which a "U-shaped" EM preventing liner 66 abuts the diffusion barrier 58' that separates conductive materials 64 and 68 from the dielectric material 54B. FIG. 3B illustrates a second embodiment in which a space is located between the "U-shaped" EM preventing liner 66 and the diffusion barrier 58'. FIG. 3C illustrates a third embodiment in which a horizontal EM liner 66 abuts the diffusion barrier, while FIG. 3D illustrates a fourth embodiment of the present invention in which a space exists between the horizontal EM liner 66 and the diffusion barrier 58'.

Reference is now made to FIGS. 4A-4E which illustrate the basic processing steps that are used in forming the semiconductor structure shown in FIG. 3A. In this embodiment, the "U-shaped" EM preventing liner 66 abuts the diffusion barrier 58' that lines the at least one opening of a second dielectric material 54B. Specifically, the inventive method begins with providing the patterned interconnect structure 50 shown in FIG. 4A. The patterned interconnect structure 50 shown in FIG. 4A comprises a first interconnect level 52A and a second interconnect level 52B that are separated in part by a dielectric capping layer 60.

Figure 4A:
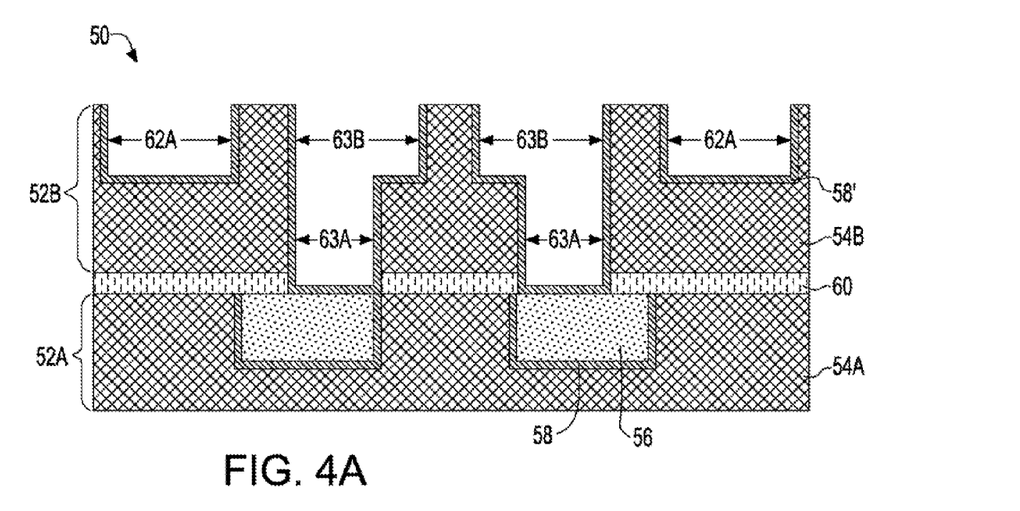
FIGS. 4A-4E are pictorial representations (through cross sectional views) illustrating the basic processing steps that are employed in forming the structure shown in FIG. 3A.

The first interconnect level 52A, which may be located above a semiconductor substrate including one or more semiconductor devices, comprises a first dielectric material 54A having at least one conductive feature 56 that is separated from the first dielectric material 54A by a diffusion barrier 58. The second interconnect level 52B comprises a second dielectric material 54B' having at least one opening located therein.

In FIG. 4A, there are shown a line opening 62A for a single damascene structure, and a via opening 63A and a line opening 63B for a dual damascene structure in the second dielectric material 54B. Although these various openings are shown, the present invention works in cases in which only a single damascene line opening is formed or damascene line and via openings are formed. When dual damascene line and via openings are formed, part of the dielectric capping layer 60 located above the at least one conductive feature 56 is removed.

The patterned interconnect structure 50 also includes a diffusion barrier 58' within the at least one opening that is formed in the second dielectric material 54B.

The patterned interconnect structure 50 shown in FIG. 4A is fabricated utilizing standard back-end-of-the-line (BEOL) processes that are well known in the art including a single damascene or dual damascene process. A first via then line opening process may be used, or a first line then via opening process may be used.

The process typically includes deposition, lithography, etching and filling of an opening with a diffusion barrier and then a conductive material, and thereafter planarization. Inasmuch as the processing details for fabricating such an interconnect structure are well known to those skilled in the art, the details are omitted herein to avoid obscuring of the current invention.

It is noted that the first interconnect level 52A of the patterned interconnect structure 50 may be formed atop a substrate (not shown in the drawings of the present application). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

The first dielectric material 54A and the second dielectric material 54B, which may be the same or different material, comprise any interlevel or intralevel dielectric including inorganic dielectrics or organic dielectrics. The first and second dielectric materials 54A and 54B respectively, may be porous or non-porous. Some examples of suitable dielectrics that can be used as the first and second dielectric materials 54A and 54B include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first and second dielectric materials 54A and 54B, respectively, typically have a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric materials may vary depending upon the dielectric material used as well as the exact number of dielectrics layers within the first and second dielectric materials. Typically, and for normal interconnect structures, the first dielectric material 54A and second dielectric material 54B each have a thickness from about 50 to about 1000 nm.

The diffusion barriers 58 and 58', which may be the same or different materials, comprise Ta, TaN, Ti, TiN, Ru, RuN, RuTa, RuTaN, W, WN or any other material that can serve as a barrier to prevent conductive material from diffusing there through. The thickness of the diffusion barriers 58 and 58' may vary depending on the deposition process used as well as the material employed. Typically, the diffusion barriers 58 and 58' each have a thickness from about 4 to about 40 nm, with a thickness from about 7 to about 20 nm being more typical.

The conductive material used in forming the conductive feature 56 includes, for example, polySi, a conductive metal, an alloy comprising at least one conductive metal, a conductive metal silicide or combinations thereof. Preferably, the conductive material that is used in forming the at least one conductive feature 56 is a conductive metal such as Cu, W or Al, with Cu or a Cu alloy (such as AlCu) being highly preferred in the present invention.

The dielectric capping layer 60 which separates, at least in part, the second interconnect level 52B from the first interconnect level 52A comprises any suitable dielectric capping material such as, for example, SiC, $Si_4NH_3$, $SiO_2$, a carbon doped oxide, a nitrogen and hydrogen doped silicon carbide (SiC(N,H) or multilayers thereof. The thickness of the dielectric capping layer 60 may vary depending on the technique used to form the same as well as the material make-up of the layer. Typically, the dielectric capping layer 60 has a thickness from about 15 to about 100 nm, with a thickness from about 25 to about 45 nm being more typical.

After providing the patterned interconnect structure 50 shown in FIG. 4A, a conductive material 64 (forming a first conductive region of the upper interconnect level 52B) is partially formed within the at least one opening (via and/or line openings) in the second dielectric material 54B. The conductive material 64 may comprise the same or different conductive material as defined above for the at least one conductive feature 56. Preferably, the conductive material 64 is Cu, W or Al, with Cu or a Cu alloy (such as AlCu) being more preferred in the present invention. The conductive material 64 may be formed by partially filling the at least one opening in the second dielectric material 54B or by fully filling the at least one opening and then recessing the conductive material to a level below the upper surface of the second dielectric material 54B. Any conventional deposition process including chemical vapor deposition (CVD), plasma enhanced chemical vapor deposition (PECVD), sputtering, chemical solution deposition or plating that fills the at least one opening from the bottom upwards can be used. Preferably, a bottom-up plating process is employed.

When a recess step is employed, an etching process that selectively removes portions of the conductive material 64 is used to provide partial filling of the at least one opening in the second dielectric material 54B. It is noted that in FIG. 4B, an ideal bottom-up fill is shown. By "ideal", it is meant that the fill occurs mainly from the lower portion of the opening upwards.

Figure 4B:
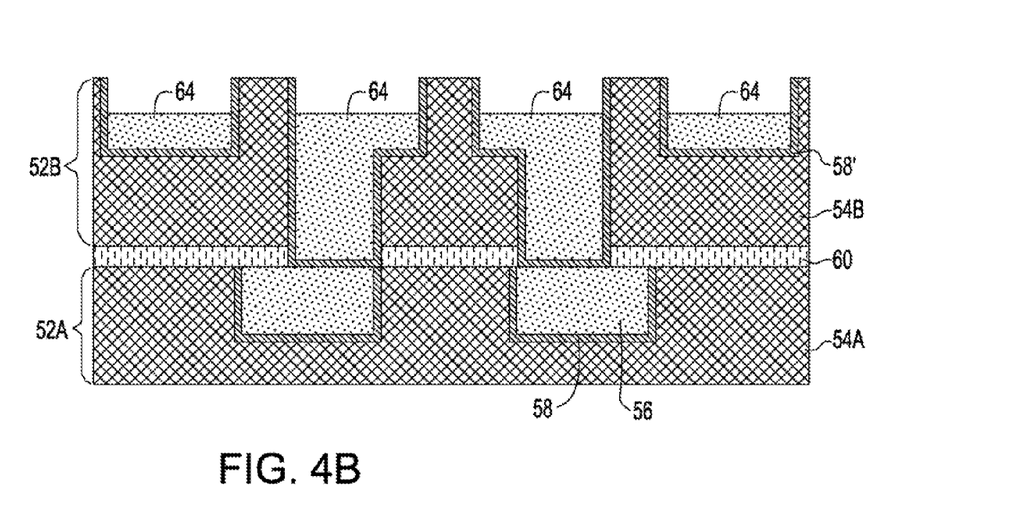
Figure 4C:
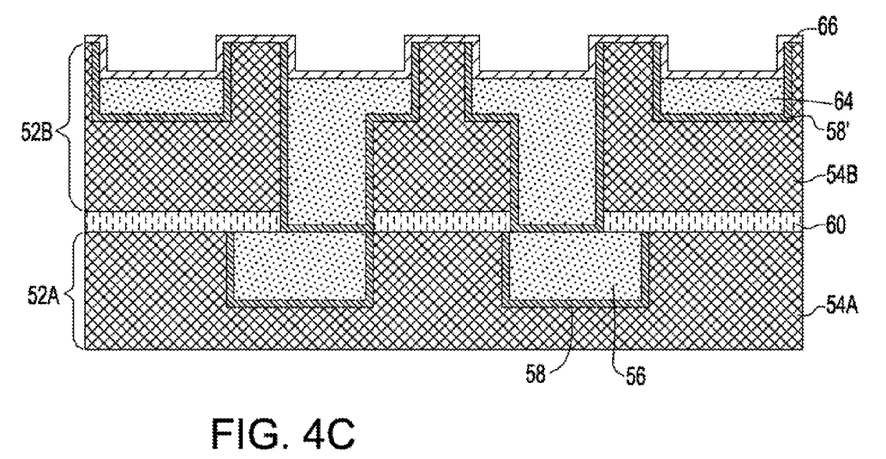

Reference is now made to FIG. 4C which illustrates the structure after an EM preventing liner 66 is formed on all the exposed surfaces (including horizontal and vertical) of the structure shown in FIG. 4B. The EM preventing liner 66 comprises Ta, TaN, Ti, TiN, Ru, RuN, RuTa, RuTaN, Ir, IrCu, Co(W,B,P,Mo,Re) or any like material that can prevent EM failure. In the embodiment shown in FIG. 4C, the EM preventing liner 66 is formed utilizing a non-directional deposition process such as, for example, CVD and sputtering. The EM preventing liner 66 typically has a thickness from about 1 to about 20 nm, with a thickness from about 2 to about 8 nm being more typical.

Figure 5:
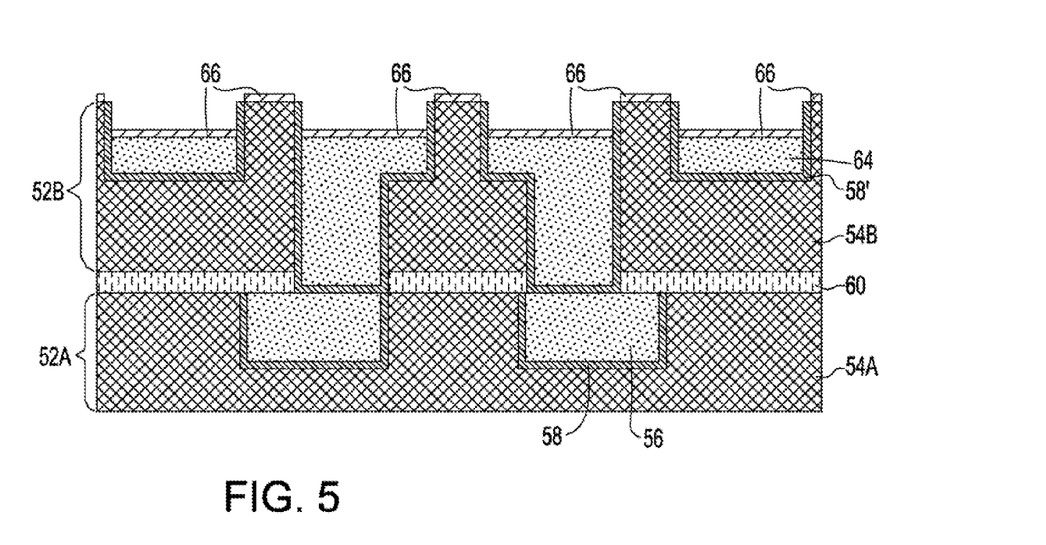
FIG. 5 is a pictorial representation (through a cross sectional view) of an intermediate structure that is used in forming the structure shown in FIG. 3C.

In another embodiment of the present invention, the EM preventing liner 66 can be formed utilizing a directional deposition process that selectively deposits the EM preventing liner only one horizontal surfaces of the structure. This embodiment of the present invention is shown, for example, in FIG. 5. It is noted that this embodiment of the present invention, also includes a catalytic plating process in which the EM preventing liner 66 is only formed on the exposed horizontal surfaces of the conductive material 64. In such an embodiment (not shown), no EM preventing liner is formed on the second dielectric material 64B. The directional deposition of the EM preventing liner 66 is used in forming the interconnect structures shown, for example, in FIGS. 3C and 3D, i.e., horizontal EM preventing liners within the conductively filled openings of the second dielectric material 54B.

For the sake of clarity, the remaining processing steps utilize the structure shown in FIG. 4C. Although such an illustration is provided, the following processing steps apply to the other embodiments of the present invention.

Figure 4D:
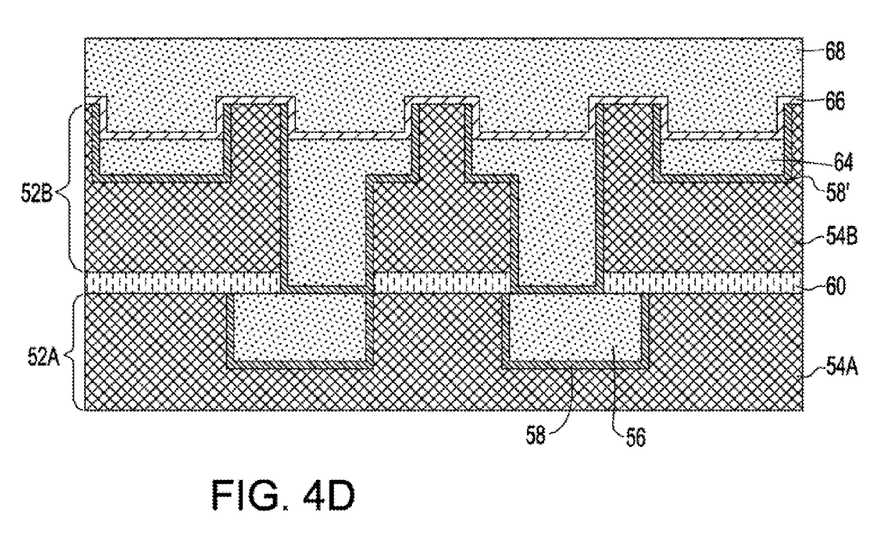

Next, and as shown in FIG. 4D, additional conductive material 68 which may comprise the same or different, preferably the same, conductor as conductive material 64 is formed. Any conventional deposition process can be used in forming the structure shown in FIG. 4D. It is noted that the conductive material 68 forms a second conductive region of the upper interconnect level 52B.

Figure 4E:
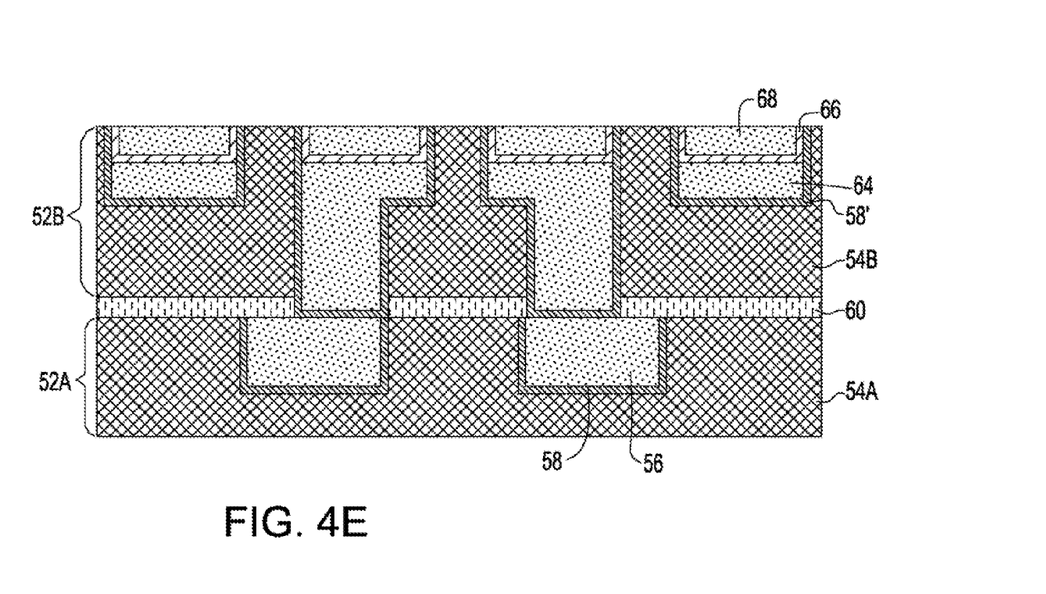

FIG. 4E illustrates the structure after planarizing the additional conductive material 68 such that an upper surface thereof is substantially co-planar to an upper surface of the second dielectric material 54B. It is noted that during this planarization step any EM preventing liner located atop the second dielectric material 54B is removed. Planarization may be achieved by chemical mechanical polishing and/or grinding.

After planarization, a second dielectric capping layer 60' is formed on the structure shown in FIG. 4E so as to provide the structure shown in FIG. 3A. The second dielectric capping layer 60' may be comprised of the same or different material as the first dielectric capping layer 60.

In another embodiment of the present invention, non-ideal deposition of the conductive material 64 occurs when partially filling the at least one opening in the second dielectric material 54B. This embodiment of begins by first providing the patterned interconnect structure 50 illustrated in FIG. 4A. Next, non-ideal deposition of the conductive material 64 occurs providing the structure shown, for example, in FIG. 6. When non-ideal deposition occurs, portions of the at least one opening that are in proximity to the patterned vertical walls of the second dielectric material 54B also include the conductive material 64. Hence, this embodiment is not an ideal bottom-up deposition. This non-ideal deposition occurs in most cases.

Figure 6:
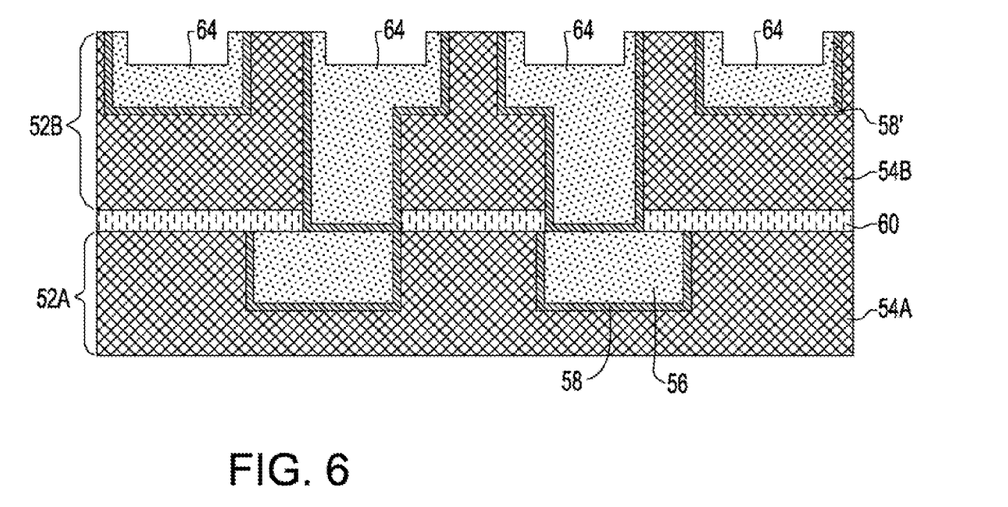
FIG. 6 is pictorial representation (through a cross sectional view) depicting a non-ideal bottom-up deposition process used in partially filling at least one opening of a dielectric material.

Following the formation of the structure shown in FIG. 6, the processing steps described above can be used in forming the structures shown in FIGS. 3C and 3D.

As mentioned above, the present invention provides an interconnect structure having improved EM reliability by incorporating an EM preventing liner within a metal interconnect. Other benefits of the inventive structure include: prevention of sudden data loss and enhancement of the lifetime of the semiconductor product.

In addition to the above, another advantage of the inventive interconnect structure is that a weak interface between the conductive feature in the second dielectric material 54B and the overlying dielectric capping layer 60' is avoided. Also, the inventive structure is capable of modulating stress than prior art interconnect structures.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating an interconnect structure comprising:

providing at least one opening in a dielectric material, said at least one opening is lined with a diffusion baffler and said dielectric material is comprised of $SiO_2$, silsesquioxanes, C doped oxides that include atoms of Si, C, O and H, thermosetting polyarylene ethers, or multilayers thereof;

forming a first conductive region comprising Cu or a Cu alloy utilizing a bottom-up deposition fill process within said at least one opening;

forming an electromigration (EM) preventing liner comprising Ta, TaN, Ti, TiN, Ru, RuN, RuTaN, RuTaN, Ir, IrCu or Co(W,B,P,Mo,Re) and having a thickness from about 2 to about 8 nm by a non-selective deposition process on at least a surface of said first conductive region, said EM preventing liner is U-shaped and abuts said diffusion barrier; and forming a second conductive region comprised of Cu or a Cu alloy on said EM preventing liner, said first and second conductive regions from a conductive feature within said dielectric material.

* * * * *